US007295443B2

(12) United States Patent

Mambakkam et al.

(10) Patent No.: US 7,295,443 B2

(45) Date of Patent: *Nov. 13, 2007

(54) SMARTCONNECT UNIVERSAL FLASH MEDIA CARD ADAPTERS

(75) Inventors: Sreenath Mambakkam, San Jose, CA (US); Arockiyaswamy Venkidu, Menlo Park, CA (US); Larry Lawson Jones, Palo Alto, CA (US)

(73) Assignee: Onspec Electronic, Inc., Cupertino, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/492,556

(22) Filed: Jul. 24, 2006

(65) Prior Publication Data

US 2006/0264110 A1 Nov. 23, 2006

Related U.S. Application Data

(63) Continuation of application No. 10/887,635, filed on Jul. 8, 2004, now Pat. No. 7,095,618, which is a continuation-in-part of application No. 10/064,966, filed on Sep. 4, 2002, now Pat. No. 6,859,369, which is a continuation-in-part of application No. 10/167,925, filed on Jun. 11, 2002, which is a continuation of application No. 09/610,904, filed on Jul. 6, 2000, now Pat. No. 6,438,638.

(51) Int. Cl.
*H05K 7/05* (2006.01)

(52) U.S. Cl. ....................... 361/737; 439/638; 439/946

(58) Field of Classification Search ................ 361/737, 361/752, 730, 736; 439/945, 946, 638; 235/492
See application file for complete search history.

(56) References Cited

U.S. PATENT DOCUMENTS 5,296,692 A 3/1994 Shino (Continued)

FOREIGN PATENT DOCUMENTS

DE 20109810 U 8/2001

(Continued)

OTHER PUBLICATIONS

Supplementary Search Report for EP Application No. 01952974.2, 3 pages, Sep. 21, 2004.

(Continued)

*Primary Examiner*—Dean A. Reichard
*Assistant Examiner*—Dameon E. Levi
(74) *Attorney, Agent, or Firm*—Greenberg Traurig, LLP

(57) ABSTRACT

A multi-memory media adapter comprised of a first planar element having an upper surface and a lower surface, a second planar element having an upper surface and a lower surface, and formed from a single material. The two planar elements form at least one port, each port capable of receiving one or more types of a memory media card. The adapter has at least one set of contact pins protruding from the lower surface of the first planar element or the upper surface of the second planar element such that the at least one set of contact pins are disposed within the port. The at least one set of contact pins are capable of contacting the contacts of a memory media card inserted into the port. For one embodiment a controller chip is embedded within the single material forming the multi-memory media adapter.

14 Claims, 5 Drawing Sheets

U.S. PATENT DOCUMENTS

| | | | | |
|---|---|---|---|---|
| 5,394,206 | A | 2/1995 | Cocca | |
| 5,471,038 | A | 11/1995 | Eisele et al. | |
| 5,576,698 | A | 11/1996 | Card et al. | |
| 5,584,043 | A | 12/1996 | Burkart | |
| 5,589,719 | A | 12/1996 | Fiset | |
| 5,640,541 | A | 6/1997 | Bartram et al. | |
| 5,679,007 | A | 10/1997 | Potdevin et al. | |
| 5,729,204 | A | 3/1998 | Fackler et al. | |
| 5,752,857 | A | 5/1998 | Knights | |
| 5,786,769 | A | 7/1998 | Coteus et al. | |
| 5,802,553 | A | 9/1998 | Robinson et al. | |
| 5,815,426 | A | 9/1998 | Jigour et al. | |
| 5,828,905 | A | 10/1998 | Rao | |
| 5,844,910 | A | 12/1998 | Niijima et al. | |
| 5,877,975 | A | 3/1999 | Jigour et al. | |
| 5,887,145 | A | 3/1999 | Harari et al. | |
| 5,892,213 | A | 4/1999 | Ito | |
| 5,905,888 | A | 5/1999 | Jones et al. | |
| 5,928,347 | A | 7/1999 | Jones | |
| 5,930,496 | A | 7/1999 | MacLaren et al. | |
| D416,541 | S | 11/1999 | Hirai et al. | |
| 5,995,376 | A | 11/1999 | Schultz et al. | |
| 6,002,605 | A | 12/1999 | Iwasaki et al. | |
| 6,006,295 | A | 12/1999 | Jones et al. | |
| 6,009,492 | A | 12/1999 | Matsuoka | |
| 6,015,093 | A | 1/2000 | Barrett et al. | |
| 6,026,007 | A | 2/2000 | Jigour et al. | |
| 6,067,234 | A | 5/2000 | Kim et al. | |
| 6,075,706 | A | 6/2000 | Learmonth et al. | |
| 6,088,802 | A | 7/2000 | Bialick et al. | |
| 6,097,605 | A | 8/2000 | Klatt et al. | |
| 6,102,715 | A | 8/2000 | Centofante | |
| 6,132,223 | A | 10/2000 | Seeley et al. | |
| 6,145,046 | A | 11/2000 | Jones et al. | |
| 6,170,029 | B1 | 1/2001 | Kelley et al. | |
| 6,175,517 | B1 | 1/2001 | Jigour et al. | |
| 6,182,162 | B1 | 1/2001 | Estakhri et al. | |
| 6,189,055 | B1 | 2/2001 | Eisele et al. | |
| 6,199,122 | B1 | 3/2001 | Kobayashi | |
| 6,202,932 | B1 | 3/2001 | Rapeli | |
| 6,203,378 | B1 | 3/2001 | Shobara et al. | |
| 6,264,506 | B1 | 7/2001 | Yasufuku et al. | |
| 6,266,724 | B1 | 7/2001 | Harari et al. | |
| 6,279,069 | B1 | 8/2001 | Robinson et al. | |
| 6,292,863 | B1 | 9/2001 | Terasaki et al. | |
| 6,330,688 | B1 | 12/2001 | Brown | |
| 6,353,870 | B1 | 3/2002 | Mills et al. | |
| 6,402,558 | B1 * | 6/2002 | Hung-Ju et al. | 439/638 |
| 6,405,323 | B1 | 6/2002 | Lin et al. | |
| 6,408,352 | B1 | 6/2002 | Hosaka et al. | |
| 6,413,108 | B2 | 7/2002 | Centofante | |
| 6,438,638 | B1 * | 8/2002 | Jones et al. | 710/301 |
| 6,470,284 | B1 | 10/2002 | Oh et al. | |
| 6,490,163 | B1 | 12/2002 | Pua et al. | |
| 6,578,125 | B2 | 6/2003 | Toba | |
| 6,581,830 | B1 | 6/2003 | Jelinek et al. | |
| 6,599,147 | B1 | 7/2003 | Mills et al. | |
| 6,658,516 | B2 | 12/2003 | Yao | |
| 6,684,283 | B1 | 1/2004 | Harris et al. | |
| 6,718,274 | B2 | 4/2004 | Huang et al. | |
| 6,738,259 | B2 | 5/2004 | Le et al. | |
| 6,746,280 | B1 * | 6/2004 | Lu et al. | 439/630 |
| 6,751,694 | B2 | 6/2004 | Liu et al. | |
| 6,761,313 | B2 | 7/2004 | Hsieh et al. | |
| 6,761,320 | B1 | 7/2004 | Chen | |
| 6,832,281 | B2 | 12/2004 | Jones et al. | |
| 6,839,864 | B2 | 1/2005 | Mambakkam et al. | |
| 6,859,369 | B2 * | 2/2005 | Mambakkam et al. | 361/737 |
| 7,062,584 | B1 | 6/2006 | Worrell et al. | |
| 7,095,618 | B1 * | 8/2006 | Mambakkam et al. | 361/737 |
| 2002/0032813 | A1 | 3/2002 | Hosaka et al. | |
| 2002/0178307 | A1 | 11/2002 | Pua et al. | |
| 2002/0185533 | A1 | 12/2002 | Shieh et al. | |
| 2003/0038177 | A1 | 2/2003 | Morrow | |
| 2003/0041203 | A1 * | 2/2003 | Jones et al. | 710/301 |
| 2003/0084220 | A1 | 5/2003 | Jones et al. | |
| 2003/0093606 | A1 | 5/2003 | Mambakkam et al. | |
| 2004/0027879 | A1 | 2/2004 | Chang | |
| 2004/0073736 | A1 | 4/2004 | Oh et al. | |

FOREIGN PATENT DOCUMENTS

| | | | |
|---|---|---|---|
| EP | 0775964 | A2 | 9/1996 |
| EP | 0987876 | A2 | 8/1997 |
| EP | 1043884 | A1 | 10/2000 |
| EP | 1139208 | A1 | 10/2001 |
| JP | 6195524 | | 7/1994 |
| JP | 08235028 | A | 9/1996 |
| JP | 11053485 | A | 2/1999 |
| TW | 490889 | B | 6/2002 |

OTHER PUBLICATIONS

Antec, Inc., "PhotoChute3 USB," product manual, pp. 1-18, available at least by Apr. 26, 1999.

Burge, Leland L., et al., "A Ubiquitous Stable Storage for Mobile Computing Devices," ACM, Proceedings of the 2001 ACM Symposium on Applied Computing, pp. 401-404, Mar. 2001.

CompactFlash Association, "CF+ and Compact Flash Specification," Rev. 1.4, 5 pages, Jul. 1999.

CQ Publishing of Japan, "Interface," pp. 52-131, Dec. 1, 1999 (article and English translation).

Twice.com, "Digital Imaging Well Exposed at RetailVision," 1 page, Apr. 26, 1999.

Lexar Media Web Pages—Parallel Port, Universal Readers, FAQ, Jumpshot, Jun. 5, 2000 (copy not available; previously submitted in parent U.S. Appl. No. 09/610,904).

Microtouch Smart Media to PCMCIA Adapter Product Sheet, Jun. 8, 2000 ( copy not available; previously submitted in parent U.S. Appl. No. 09/610,904).

* cited by examiner

CONNECTOR PINS

| PIN | SMART MEDIA | MMC/ SD | MEMORY STICK |
|---|---|---|---|
| 1 | D0/-WPSW | | |
| 2 | D1 | -WP | |
| 3 | D2 | -CD | |
| 4 | D3 | MCMD | |
| 5 | D4 | | -CD |
| 6 | D5 | | BS |
| 7 | D6 | | SDIO |
| 8 | D7 | | |
| 9 | LVD | | |
| 10 | -WE | D0 | |
| 11 | -RE | D1 | |
| 12 | -ALE | D2 | |
| 13 | -CLE | D3 | |
| 14 | READY | | |
| 15 | -CE | | |
| 16 | -WP | | |
| 17 | -WPSW | | |
| 18 | GROUND | GROUND | GROUND |
| 19 | POWER | | |
| 20 | | POWER | POWER |
| 21 | | CLK | MCLK |

| PIN | XD | MMC/ SD (REGULAR SIZE) | MEMORY STICK (REGULAR SIZE) | SMART MEDIA | MINISD | RS MMC | MEMORY STICK DUO |
|---|---|---|---|---|---|---|---|
| 1 | GROUND | GROUND | GROUND | GROUND | GROUND | GROUND | GROUND |
| 2 | -CD1 | | | | | | |
| 3 | RDY | MCMD | BS | RDY | MCMD | MCMD | BS |
| 4 | -RE | SD0 | SDIO (MSD0) | -RE | SDD0 | SDD0 | SDIO (MSD0) |
| 5 | -CS | SD1 | MSD1 | -CS | SDD1 | SDD1 | MSD1 |
| 6 | CLE | SD2 | MSD2 | CLE | SDD2 | SDD2 | MSD2 |
| 7 | ALE | SD3 | MSD3 | ALE | SDD3 | SDD3 | MSD3 |
| 8 | -WE | CLK | CLK | -WE | CLK | CLK | CLK |
| 9 | WP | -WP | | WP | | | |
| 10 | D0 | -CD2 | | D0 | | | |
| 11 | D1 | | -CD3 | D1 | | | |
| 12 | D2 | | | D2/-CD4 | | | |
| 13 | D3 | | | D3 | -CD5 | | |
| 14 | D4 | | | D4 | | -CD6 | |
| 15 | D5 | | | D5 | | | -CD7 |
| 16 | D6 | | | D6/-WPSW | | | |
| 17 | D7 | | | D7/LVD | | | |
| 18 | POWER | POWER | POWER | POWER | POWER | POWER | POWER |

*FIG. 5*

SMARTCONNECT UNIVERSAL FLASH MEDIA CARD ADAPTERS

CROSS-REFERENCES TO RELATED APPLICATIONS

Under 35 U.S.C. §120, this application is a continuation application of U.S. application Ser. No. 10/887,635 filed Jul. 8, 2004, now U.S. Pat. No. 7,095,618, which is a continuation-in-part application of U.S. application Ser. No. 10/064,966, which was filed on Sep. 4, 2002, now U.S. Pat. No. 6,859,369 which is a continuation-in-part application of U.S. application Ser. No. 10/167,925, which was filed on Jun. 11, 2002, now U.S. Pat. No. 7,222,205, which is a continuation application of U.S. application Ser. No. 09/610,904 which was filed Jul. 6, 2000, now U.S. Pat. No. 6,438,638, and is titled "Flashtoaster for reading several types of flash-memory cards with or without a PC." U.S. patent application Ser. No. 10/064,966 is also a continuation-in-part application of U.S. application Ser. No. 10/039,685 which was filed Oct. 29, 2001, now U.S. Pat. No. 6,832,281 and is titled, "Flashtoaster for reading several types of flash memory cards with or without a PC" and a continuation-in-part application of U.S. application Ser. No. 10/002,567 which was filed Nov. 1, 2001 and is titled, "Active Adapter Chip for Use in a Flash Card Reader." The priority of the above-referenced applications is hereby claimed, and the entirety of the above-referenced applications are incorporated herein by this reference, and all of the above-referenced applications are assigned to the assignee of the present invention.

COPYRIGHT NOTICE/PERMISSION

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present invention relates generally to flash media adapters, and more specifically to an improved configuration of the same.

BACKGROUND OF THE INVENTION

In U.S. patent application Ser. No. 10/002,567, entitled "Active Adapter Chip for Use in a Flash Card Reader", filed Nov. 1, 2001, and assigned to the assignee of the present application, a universal active adapter chip is disclosed that can be used to construct a flash media system or various active flash media adapters using the CompactFlash card or PCMCIA (PC Card) form factor. A standard reader that reads CompactFlash cards or PC cards can then read any of the other flash-memory cards that plug into the CompactFlash or PC Card adapter. The adapters come with a conversion chip that makes each of the flash media work just like a CompactFlash or PC Card media, as applicable.

FIG. 1 shows a multi-standard card reader system 142. In the field of multi-standard adapters, multi-memory media adapter 140 may be an active adapter or, alternatively, may be a passive adapter. Reader 142 can adapt on the host side to either CompactFlash card 149, PCMCIA card 153, or IDE card 151 On the media side, the reader can adapt to a MultiMediaCard 141, or a Secure Digital card 143, which have the same form factor but slightly different pin-out; a SmartMedia card 145, which has a different pin-out; or a Memory Stick 147. In general, the reader 142 can adapt to any generic flash media 146 that has a similar or smaller form factor.

It is possible to place the connector such that all the media sit in one opening. FIG. 2 is a cutaway side view of a PCMCIA adapter card 200 of the type that is available as a standard commercial product today. FIG. 2 illustrates several drawbacks in the typical configuration of a PCMCIA adapter. Adapter 200 includes two PCBs, namely PCB 210 and PCB 220. The two PCBs are separated by a mounting frame (typically plastic), not shown. The mounting frame acts as a spacer between PCB 210 and PCB 220, which holds the two PCBs together at a specified distance and functions in other capacities as described below. The space between the two PCBs creates the opening (port) 211 into which the flash media cards are inserted. PCB 230 is straddle-mounted between PCB 210 and PCB 220. PCB 230 contains the active components including controller chip 231 that perform handshaking and data transfer. PCB 230 is connected to a PCMCIA connector 240. PCB 230 is mounted between PCB 210 and PCB 220 with interconnects 212. PCB 210 has two sets of floating contact pins, contact pin set 214 includes nine contact pins and contact pin set 215 includes ten contact pins, which provide interfaces for MMC/SD and Memory-Stick flash media respectively. PCB 220 has two sets of floating contact pins 224 and 225, each including 11 pins, which together provide the interface for SmartMedia flash media.

The mounting frame that holds PCB 210 and 220 together is configured such that each type of flash media is inserted in a particular location within the connector. In FIG. 2, opening 211 is a simplified view. Typically, the opening is stepped with different widths and heights in different locations that index the flash media cards into specific locations upon insertion. This allows each flash medium to be properly aligned with the corresponding contact pin set(s). Additionally, stops are typically provided to stop the insertion at the correct depth, again, to guarantee connection to the right contact pin set.

This typical approach has several serious drawbacks.

Manufacturing

The straddle-mount configured flash media adapter is very expensive to manufacture for several reasons. Often such devices require manual labor for manufacturing and testing, or the use of very expensive soldering robots, instead of standard production techniques. A further problem is the additive effect of manufacturing tolerances, such as primary connector (i.e., PCMCIA) to PCB, to straddle mount connector to secondary PCB to contacts on PCB, resulting in as many as two, three, or in some cases even four tolerances adding up, which makes requirements for tolerances either absurdly expensive, or causes a big yield problem in manufacturing. Additionally, PCB 230 must be thin enough so that it can be mounted between PCB 210 and PCB 220 in the space allocated for the insertion of the various flash media. That is, PCB 230, together with the interconnects 212 that mount it between PCB 210 and PCB 220 must be no larger than opening 211 The manufacture of thin PCBs to accommodate this design point adds to the expense and complexity of manufacturing the flash media adapter.

Contact Pins

The floating contact pins are subject to damage and deterioration. The various flash media cards have different thickness, and even the same flash media may have different thickness if produced by different manufacturers. The flash media cards exert pressure upon the floating contact pins, which eventually causes their resiliency to be reduced. When subsequently, a thinner flash media card is inserted into the flash media adapter, the corresponding contact pins may not make connection with the flash media card. Additionally if a flash media card is inserted incorrectly (e.g., upside down), removal of the flash media card may damage the contact pins.

Interface

Some devices don't have the 68-pin PCMCIA interface. For example, some recent notebook computer models only have the electrically equivalent 50-pin CF interface. Typical adapter cards such as PCMCIA adapter card 200 are incompatible with a 50-pin CF interface.

SUMMARY

An embodiment of the present invention provides a multi-memory media adaptor comprised of a first planar element having an upper surface and a lower surface and a second planar element having an upper surface and a lower surface. The two planar elements are formed from a single piece of molded plastic and disposed so as to form a port capable of receiving a memory media card. The adapter has at least one set of contact pins protruding from the lower surface of the first planar element or the upper surface of the second planar element such that the at least one set of contact pins are disposed within the port. The at least one set of contact pins are capable of contacting the contacts of a memory media card inserted into the port.

Other features and advantages of embodiments of the present invention will be apparent from the accompanying drawings, and from the detailed description, that follows below.

BRIEF DESCRIPTION OF THE DRAWINGS

The invention may be best understood by referring to the following description and accompanying drawings that are used to illustrate embodiments of the invention. In the drawings:

FIG. 5 is a table of pin mappings for the xD, standard MMC/SD, standard Memory Stick, SmartMedia, miniSD, RSMMC, and MS Duo to an 18-pin connector in accordance with one embodiment of the present invention;

DETAILED DESCRIPTION

Figure 1:
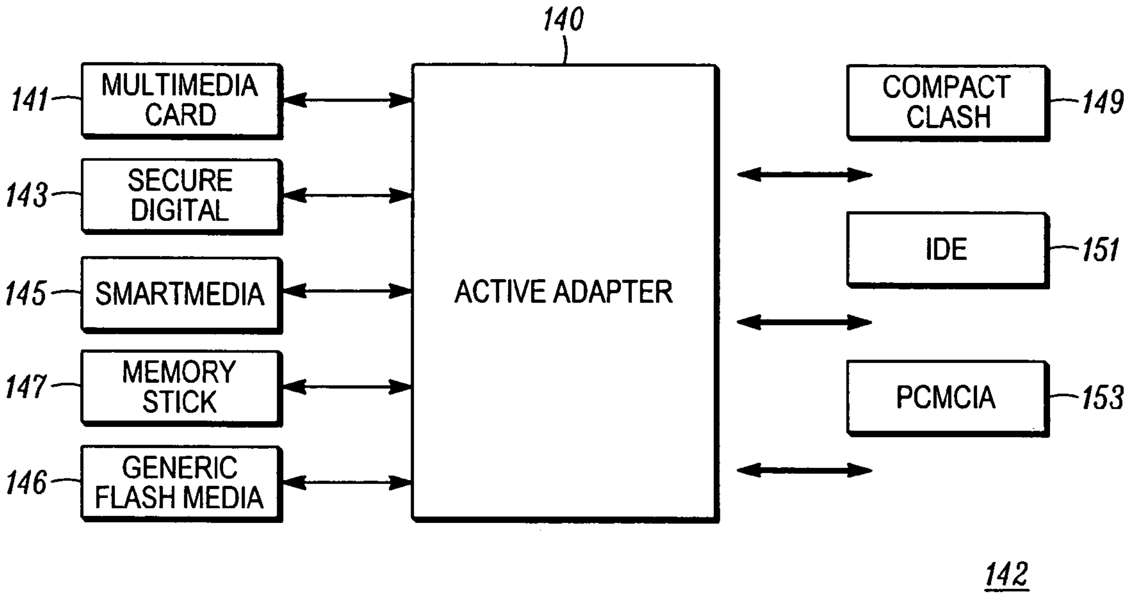
(PRIOR ART) FIG. 1
FIG. 1 illustrates a multi-standard card reader system.

An embodiment of the present invention provides a multi-memory media adapter card configured to reduce or eliminate some of the drawbacks of typical adapter card configuration. In accordance with various embodiments of the present invention, the top and bottom PCBs of prior art configurations are replaced by molded plastic elements that provide greater structural integrity. The straddle-mounted controller board is replaced with a PCB adjacent to the bottom element and having a surface mounted standard connector that may be a PCMCIA or a CompactFlash connector. The contact pins are formed so as to better maintain their resiliency and avoid damage upon removal of the memory media card. In one embodiment, a light pipe is locked in place between the top and bottom elements of the adapter card so as to conduct light from a signal lamp on the PCB through the port.

It is an intended advantage of one embodiment of the present invention to reduce the manufacturing cost and complexity of an adapter card. It is another intended advantage of one embodiment of the present invention to provide an adapter card with greater structural integrity. It is another intended advantage of one embodiment of the present invention to provide an adapter card with contact pins that retain their resiliency to a greater degree than floating contact pins. It is another intended advantage of one embodiment of the present invention to provide an adapter card with contact pins that are less likely to be damaged upon removal of a memory media card. It is another intended advantage of one embodiment of the present invention to provide an adapter card with a surface mounted standard connector including PCMCIA and CompactFlash connectors.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Figures 3, 4:
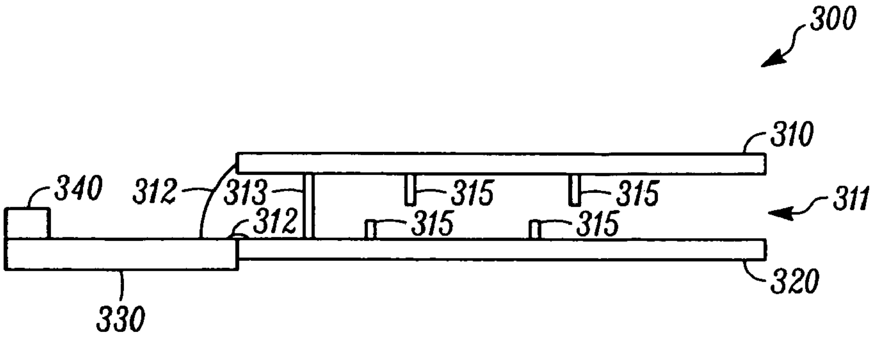
FIG. 3 is a cutaway side view of an integrated standard connector adapter card according to one embodiment of the present invention.
FIG. 4 is a table of pin mappings for the SmartMedia, MMC/SD, and Memory Stick to a 21-pin connector in accordance with one embodiment of the present invention.

FIG. 3 is a cutaway side view of an integrated standard connector adapter card according to one embodiment of the present invention. Adapter card 300, shown in FIG. 3, includes a top planar element 310 and a bottom planar element 320, both of which may be PCBs. Alternatively, the top planar element 310 and the bottom planar element 320 may be formed from molded plastic. A spacer, not shown, holds the two planar elements apart, forming port 311 into which memory media cards are inserted. In order to meet the low height requirements (thickness of PCMCIA or CF cards), the ports are registered on one opening, and contacts are distributed on both sides. Additionally, the port 311 may be formed with card stops to prevent improper insertion of memory media cards.

For one embodiment, both planar elements and the spacer between them are created from molded plastic. For such an embodiment, the molded plastic provides greater resistance to pressure applied to the outer surfaces of adapter card 300. This helps to prevent planar element 310 and planar element 320 from contacting each other and possibly damaging internal components.

Adapter 300 also includes a number of sets of contact pins, shown collectively as contact pin set 315, protruding from the lower surface of planar element 310 and from the upper surface of planar element 320. The contact pins electrically couple to corresponding contacts on a memory media card inserted into port 311. For an embodiment in which the planar elements 310 and 320 are formed from molded plastic, contact pin sets 315 may be formed from injected contacts with protruding pins. This provides a more robust contact pin than the floating contact pins of the prior art, thereby lessening the likelihood that the resiliency of the contact pin will be reduced to the point that the pin no longer contacts the inserted memory media card. Alternatively, or additionally, the contact pins may be angled or shaped such that damage due to the abrupt removal of an improperly (or properly) inserted card is reduced or eliminated. For example the terminal end of the contact pin may be angled or curved toward the planar surface from which the contact pin protrudes, or may be spherically shaped.

Adapter 300 includes planar element 330 that has standard connector 340 mounted thereon. Planar element 330 is adjacent to bottom planar element 320. Standard connector 340, which may be for example, a compact flash, PCMCIA, USB, or serial ATA connector is surface-mounted to planar element 330. Interconnects 312 that electrically connect the standard connector 340 to contact pins 315 are also located on planar element 330. In accordance with an embodiment of the present invention, the need for a straddle-mounted PCB, and its associated manufacturing costs and complexity, is eliminated. Moreover, by eliminating the layers of a straddle-mount configuration, registration accuracy is improved. For one embodiment, a single PCB may comprise bottom planar element 320 and planar element 330.

For one embodiment, a multi-memory media adapter having only 21 pins is used to accommodate various commercially available flash memory media. FIG. 4 is a table of pin mappings for the SmartMedia, MMC/SD, and Memory Stick to a 21-pin connector in accordance with one embodiment of the present invention.

Pin 18 is a ground pin for each connector. Pin 19 is a power pin for SmartMedia, while pin 20 is a power pin for MMC/SD, and Memory Stick.

The SmartMedia interface has a parallel data bus of 8 bits. These are mapped to pins 1-8. While no separate address bus is provided, address and data are multiplexed. Control signals for latch enables, write enable and protect, output enable, and ready handshake are among the control signals.

For the Memory Stick and MMC/SD flashtmemory-card interfaces, parallel data or address busses are not present. Instead, serial data transfers occur through serial data pin DIO, which is mapped to pin 7 for the Memory Stick, and pin 10 (DO) for the MMC/SD flash-memory-card interfaces. Data is clocked in synchronization to clock MCLK and CLK, for Memory Stick and MMC/SD, respectively, on pin 2L A BS, for Memory Stick, occupies pin 6, and a command signal CMD, for MMC/SD, occupies pin 4. The Memory Stick interfaces require only 4 pins plus power and ground, while MMC/SD requires 8 pins plus power and ground.

Thus, it is possible to accommodate SmartMedia, MMC/SD, and Memory Stick with a 21-pin connector (i.e., instead of 41 pins) by multiplexing the available pins. For one embodiment, the controller chip (e.g., controller chip 231) differentiates the pin configuration for each flash memory media type.

For an alternative embodiment, a multi-memory media adapter, having only 18 pins, is used to accommodate various commercially available flash memory media including media that have recently become commercially available. Such recent additions include a miniSD card (i.e., an MMC/SD card with a smaller form factor), an MS Duo (i.e., a Memory Stick card with a smaller form factor), a Reduced Size MultiMedia Card (RSMMC), and an xD card (a controller-less Flash media, similar in function to SmartMedia).

FIG. 5 is a table of pin mappings for the xD, standard MMC/SD, standard Memory Stick, SmartMedia, miniSD, RSMMC, and MS Duo to an 18-pin connector in accordance with one embodiment of the present invention.

For such an embodiment, pin 1 is a ground pin and pin 18 is a power pin for each connector. The data lines for the SmartMedia and xD interface cards have a parallel data bus of 8 bits denoted as DO-D7 that occupy pins 10-17. These data bus lines are multiplexed to serve as card-detect lines for the remaining media types. While no separate address bus is provided, address and data are multiplexed. Control signals for latch enables, write enable and protect, output enable, and ready handshake are among the control signals.

The data lines of the miniSD and RSMMC and the Memory Stick (and MS Duo) flash-memory-card interfaces are denoted as SDDO-SDD3 and MSDO-MSD3, respectively, and occupy pins 4-7.

Thus, it is possible to accommodate xD, standard MMC/SD, standard Memory Stick, SmartMedia, miniSD, RSMMC, and MS Duo with an 18-pin connector by multiplexing the available pins. Again, the controller chip may differentiate the pin configuration for each flash memory media type.

Figure 6:
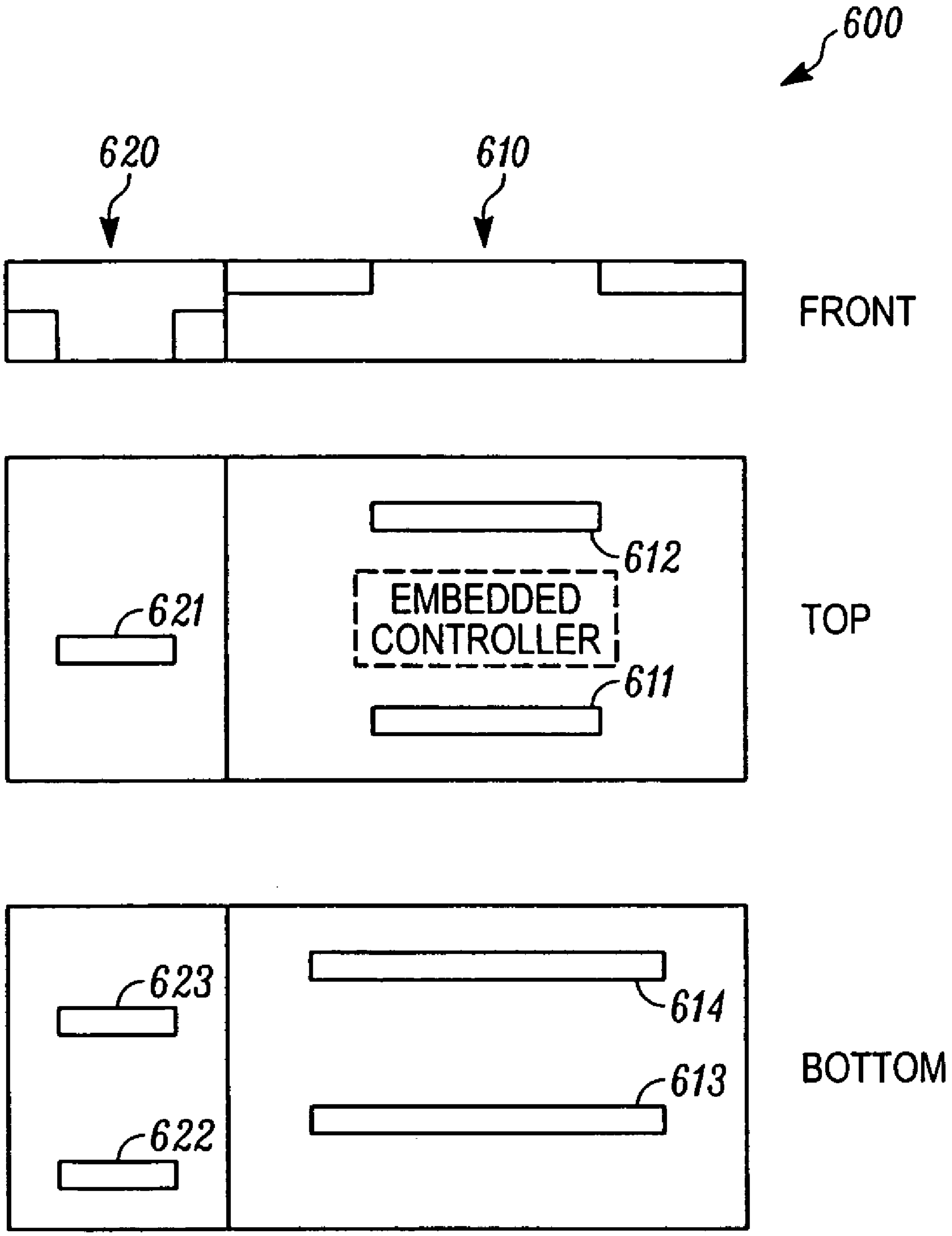
FIG. 6 illustrates an integrated standard connector adapter card, according to one embodiment of the present invention, in front view, top view, and bottom view.

FIG. 6 illustrates an integrated standard connector adapter card according to one embodiment of the present invention in front view, top view, and bottom view. Adapter card 600, shown in FIG. 6, includes two housings, namely housing 610 and housing 620. For one embodiment of the invention, the pins are in a single row. As shown from the top view of adapter card 600, a tap-front set of pins 611 in housing 610 can be used to interface to an xD card, a top-rear set of pins 612 in housing 610 can be used to interface to a Smartmedia card. A top-front set of pins 621 in housing 620 can be used to interface an RSMMC card. As shown in the bottom view of adapter card 600, a bottom-front set of pins 613 in housing 610 can be used to interface to an MMC/SD card, a bottom-rear set of pins 614 in housing 610 can be used to interface to a standard size Memory Stick card. A bottom-front set of pins 622 in housing 620 can be used to interface a miniSD card. A bottom-rear set of pins 623 in housing 620 can be used to interface a Memory Stick MS Duo.

Figure 7:
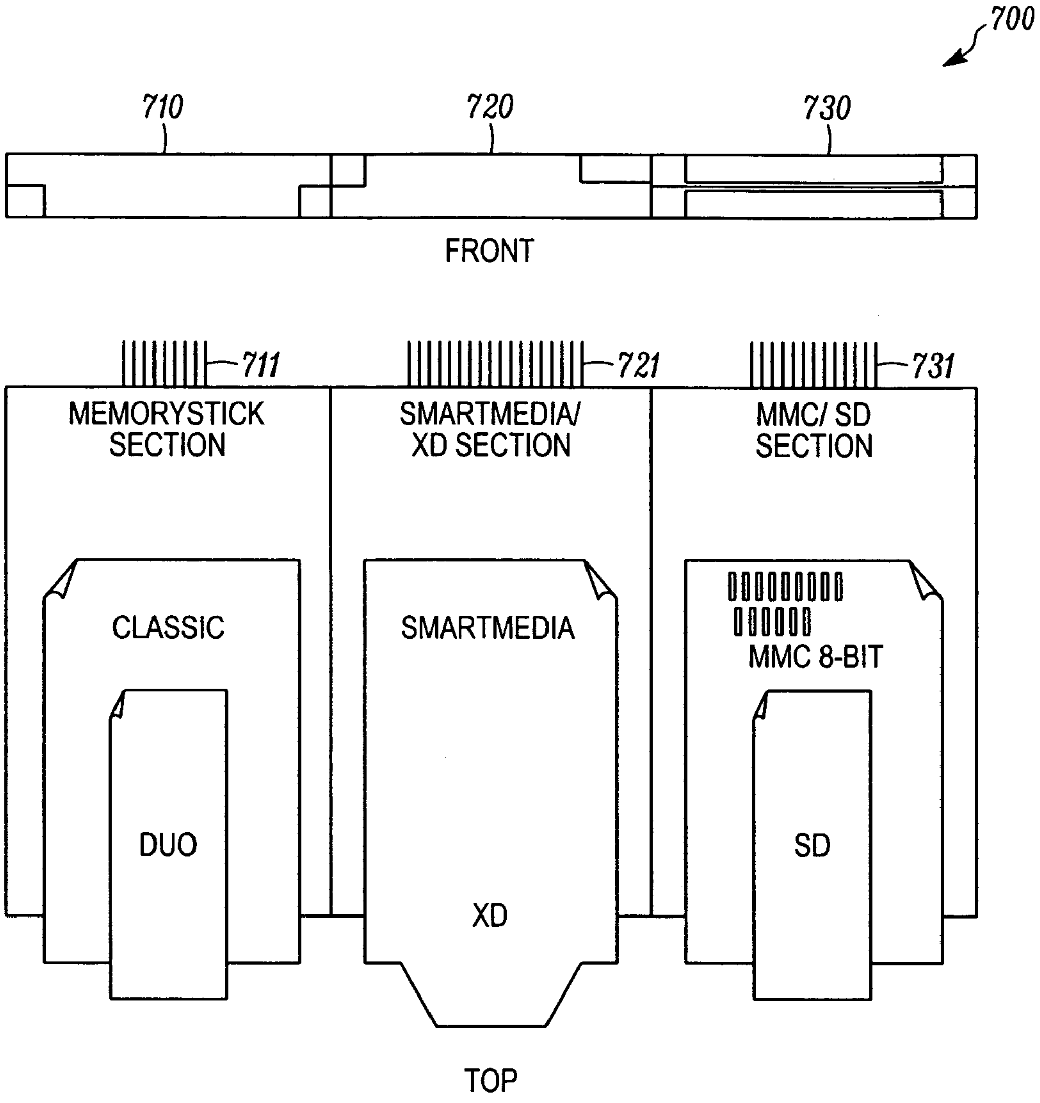
FIG. 7 illustrates an integrated standard connector adapter card, according to one embodiment of the present invention, in front view and top view.

FIG. 7 illustrates an integrated standard connector adapter card, according to one embodiment of the present invention, in front view and top view. Adapter card 700, shown in FIG. 7, includes three housings, namely section 710 (Memory Stick), section 720 (SM/xD), and section 730 (MMC/SD). This arrangement allows pins to be laid out in a planar fashion, thus effecting saving in layout and allowing for assignment of one drive for each section. The spacing is designed so that only one media can be inserted at a time. For one embodiment, the Memory Stick could be on the top portion of section 710 (with MS Duo on the bottom portion), while SmartMedia is on the top portion of section 720 with xD on the bottom portion of section 720. According to one such embodiment, the MMC (including the recently designed 8-bit MMC) could be on the top-rear portion of the MMC/SD section 730, while the SD could be on the bottom-rear portion of the MMC/SD section 730. RSMMC could be on the top-front portion of the MMC/SD section 730 and miniSD could be on the bottom-front portion of the MMC/SD section 730.

The sections 710, 720, and 730 of adapter 700 are positioned vertically. Note the external pins 711, 721, and 731, are directed from each section 710, 720, and 730, respectively, such that there is no intersection of the external connections.

Figure 7A:
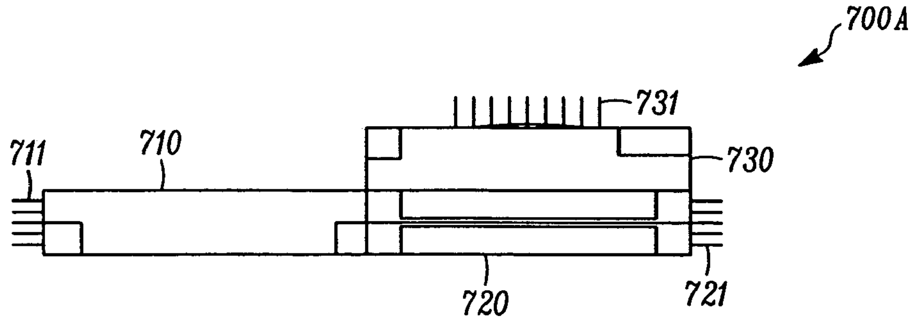
FIG. 7A illustrates an alternative embodiment of an adapter 700A in accordance with one embodiment of the invention.
Figure 1:
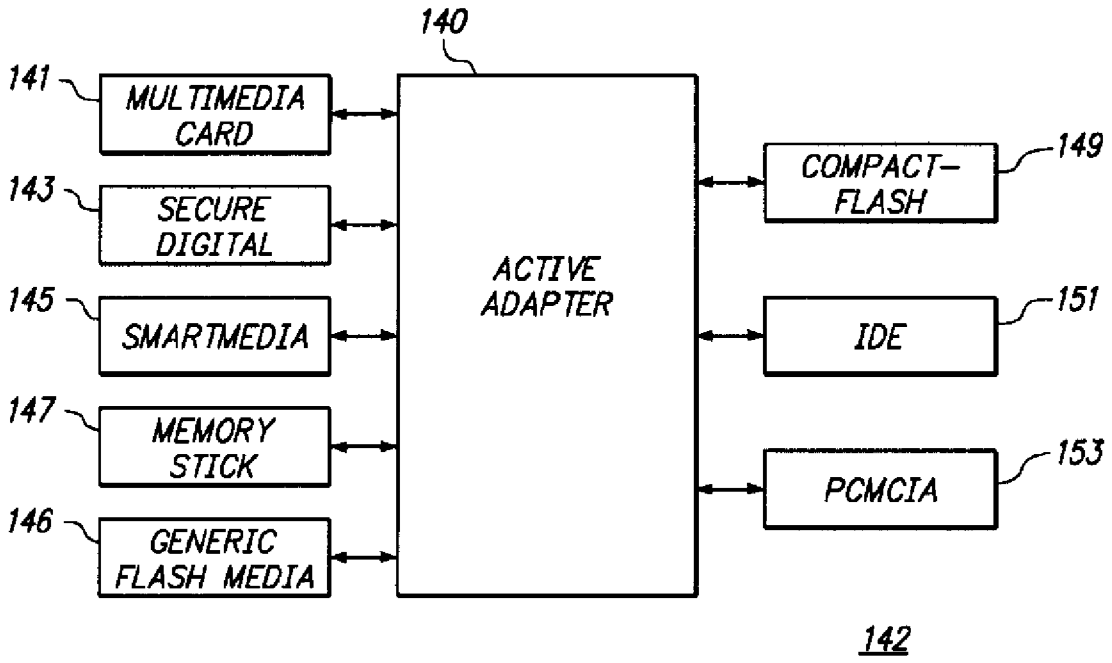
(PRIOR ART) FIG. 1
Figure 2:
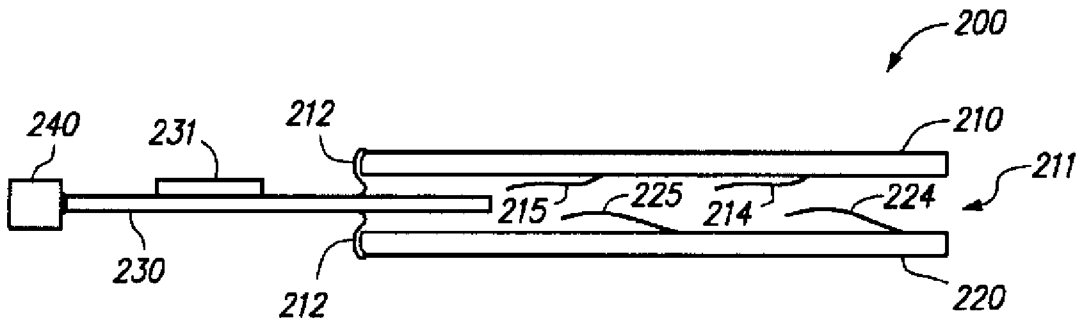
(PRIOR ART) FIG. 2

FIG. 7A illustrates an alternative embodiment of an adapter 700A in accordance with one embodiment of the invention. As shown in FIG. 7A, adapter 700 includes sections 710, 720, and 730 with sections 710 and 730 positioned vertically, but section 720 stacked horizontally upon section 730. In such an embodiment, external pins 711, 721, and 731 may be positioned as shown to avoid intersection or congestion of the external connections.

As described above in reference to FIG. 3, an adapter in accordance with one embodiment of the invention includes a planar element that may have a controller chip attached to a standard connector (e.g., PCMCIA, USB, WiFi, Firewire, IDE, CF, or serial ATA connector) mounted thereon. In accordance with an alternative embodiment of the invention, the controller chip is integrated into the housing of the adapter. For example, the adapter may be formed of a single piece of molded plastic, with the controller chip and an associated memory device (e.g., ROM) embedded into the molded plastic. For such an embodiment, the continuous molded plastic that forms the adapter also forms the device package for the controller die.

General Matters

Embodiments of the present invention provide an improved configuration for a multi-memory media adapter card. For one embodiment, the adapter may comprise an injected plastic part, forming the mechanical port, as well as holding any and all contacts in its structure, thus eliminating the multiple tolerances of conventional configurations (i.e., two PCBs sandwiching a mechanical frame). For one embodiment, two half shells with integrated contacts are snapped together, allowing for a simple, but accurate mounting by means of guides for snapping them together. In particular, the total assembly of the port may be composed of two parts, a top and bottom, each with contacts and plastic, each containing part or all of the port opening, hence reducing the number of added tolerances to a maximum of one or two. By reducing the number of sub-assemblies from three or more to two or less, an easier, more precise manufacturing can be done, with only slightly higher tooling cost. However, due to the fact that it is a high-volume, commodity-type device, the higher tooling costs would be more than offset by the lower part cost, the better yield, etc. Further, by embedding the contacts in a plastic injection, such problems as metal fatigue, travel, etc., can be controlled much better, improving dramatically the life-cycle time for the port side connectors. For one embodiment of the invention, the controller and associated memory device are integrated into the adapter, rendering the adapter a complete card reader.

For one embodiment, a light pipe may be locked in place between the two half shells to conduct light from a signal lamp (e.g., LED) on the PCB to the user side of the opening, similar to networking lights sometimes integrated into networking connectors.

For one embodiment, the straddle-mount configuration is replaced with a surface mounted standard connector. This reduces the manufacturing costs and complexities associated with the straddle-mount configuration.

For one embodiment of the invention, the controller and associated memory device are integrated into the adapter rendering the adapter a complete card reader.

Embodiments of the present invention have been described in reference to flash media such as xD, standard MMC/SD, standard Memory Stick, SmartMedia, miniSD, RSMMC, and MS Duo. In general, embodiments of the invention are applicable to any generic flash media.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A multi-memory media adapter comprising:

a first planar element having an upper surface and a lower surface, the first planar element comprising molded plastic;

a second planar element having an upper surface and a lower surface, the first planar element and the second planar element disposed such that a port is formed between the lower surface of the first planar element and the upper surface of the second planar element, the port capable of receiving a memory media card, the second planar element comprising molded plastic;

at least one set of contact pins protruding from the lower surface of the first planar element or the upper surface of the second planar element such that the at least one set of contact pins are disposed within the port, the at least one set of contact pins capable of contacting a set of memory media card contacts, wherein the at least one set of contact pins are integrated within the molded plastic of the first planar element or the second planar element; and a controller chip to map at least a subset of the at least one set of contact pins to a set of signal lines or power lines, based on an identified type of a memory media card.

2. The multi-memory media adapter of claim 1 wherein the memory media card is one of a group comprising of xD, MMC/SD, Memory Stick, miniSD, RSMMC, and MS Duo.

3. The multi-memory media adapter of claim 1 having a system connector surface-mounted thereon, the system connector electrically coupled to the at least one set of contact pins.

4. The multi-memory media adapter of claim 3 wherein the system connector is selected from the group comprising of a PCMCIA, USB, WiFi, Firewire, IDE, serial ATA connector, an IDE, and a CompactFlash connector.

5. The multi-memory media adapter of claim 1 wherein the set of contact pins are formed from injected contacts within the molded plastic of the first planar element or the second planar element.

6. The multi-memory media adapter of claim 1 wherein the contact pins are formed such that a terminal end of a contact pin of the set of contact pins is configured to be oriented away from the set of memory media card contacts during removal of the memory media card.

7. The multi-memory media adapter of claim 1 having at least 18 contact pins configured to accommodate at least one of a group comprising, an xD, MMC/SD, Memory Stick, miniSD, RSMMC, and MS Duo.

8. The multi-memory media adapter of claim 1 wherein the controller chip is embedded in the molded plastic of the first planar element or the second planar element of the multi-media memory adapter.

9. A system comprising:

a multi-memory media adapter to read data from a plurality of memory media cards, the multi-memory media adapter having at least one port formed between an upper portion and a lower portion of the multi-memory media adapter, the port to receive a memory media card of the plurality of memory media cards;

a set of contact pins protruding from the upper portion or the lower portion, the set of contact pins to contact a set of memory media card contacts, wherein the set of contact pins are integrated within molded plastic of the upper portion or the lower portion; and a controller integrated into the multi-memory media adapter to map at least a subset of the set of contact pins to a set of signal lines or power lines, based an identified type of the memory media card.

10. The system of claim 9 wherein the memory media card is at least one of a group comprising of xD, MMC/SD, Memory Stick, miniSD, RSMMC, and MS Duo.

11. The system of claim 9 further comprising a system connector, the system connector electrically coupled to the set of contact pins.

12. The system of claim 11 wherein the system connector is selected from the group comprising of a PCMCIA, USB, WiFi, Firewire, IDE, serial ATA connector, an IDE, and a CompactFlash connector.

13. The system of claim 9 wherein the contact pins are integrated within the molded plastic and formed from injected contacts within the molded plastic of the first upper portion or the lower portion.

14. The system of claim 9 having at least eighteen contact pins configured to accommodate at least one of a group comprising, an xD, MMC/SD, Memory Stick, miniSD, RSMMC, and MS Duo.

* * * * *

UNITED STATES PATENT AND TRADEMARK OFFICE

CERTIFICATE OF CORRECTION

Figure 2:
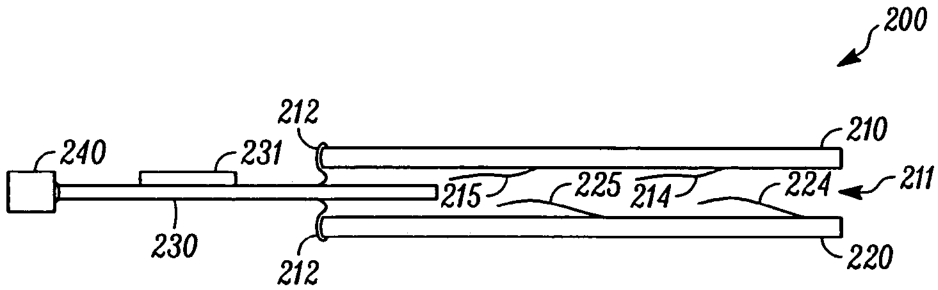
(PRIOR ART) FIG. 2
FIG. 2 is a cutaway side view of a PCMCIA adapter card of the type that is available as a standard commercial product today.

PATENT NO. : 7,295,443 B2 
APPLICATION NO. : 11/492556
DATED : November 13, 2007
INVENTOR(S) : Sreenath Mambakkam, Arockiyaswamy Venkidu and Larry Lawson Jones It is certified that error appears in the above-identified patent and that said Letters Patent is hereby corrected as shown below:

Delete drawing sheet 1, and substitute therefor the drawing sheets, consisting of FIGS 1-2, as shown on the attached pages.

In FIG. 1, reference 149, replace “Compact Clash” with --Compact-Flash--

In FIG. 1, the three right arrows should touch each of the indicated boxes.

In column 1, line 67, replace “151” with --151.--

In column 2, line 52, replace “straddle mount” with --straddle-mount--

In column 2, line 62, replace “211” with --211.--

In column 5, line 41, replace “compact flash” with --CompactFlash--

In column 5, line 42, replace “surface-mounted” with --surface mounted--

In column 5, line 66, replace “flashtmemory” with --flash-memory--

In column 5, line 62, replace “DIO” with --SDIO--

In column 6, line 3, replace “10 (DO)” with --10 (D0)--

In column 6, line 6, replace “2L A BS” with --21. A BS--

In column 6, line 7, replace “CMD” with --MCMD--

In column 6, line 54, replace “tap-front” with --top-front--

In column 6, line 56, replace “Smartmedia” with --SmartMedia--

In column 8, line 61, replace “surface-mounted” with --surface mounted--

In column 10, line 5, replace “an identified” with --on identified--

Signed and Sealed this

Thirteenth Day of October, 2009

David J. Kappos

David J. Kappos
*Director of the United States Patent and Trademark Office*